United States Patent [19]
Chang et al.

[11] Patent Number: 5,214,527
[45] Date of Patent: May 25, 1993

[54] ELECTRONICALLY SWITCHED MULTIPLE-CHANNEL OPTICAL RECEIVER

[75] Inventors: Gee-Kung Chang, Holmdel; Won-Pyo Hong, Middletown, both of N.J.

[73] Assignee: Bell Communications Research, Inc., Livingston, N.J.

[21] Appl. No.: 587,867

[22] Filed: Sep. 26, 1990

[51] Int. Cl.$^5$ .................. H04B 10/06; H04J 14/02
[52] U.S. Cl. .................. 359/189; 359/124; 250/214 A; 372/38
[58] Field of Search .......... 370/3, 1; 455/619, 617; 330/59; 250/214 A, 208.3, 208.4; 359/189, 154, 124, 117, 128; 372/38

[56] References Cited

U.S. PATENT DOCUMENTS 4,807,227  2/1989  Fujiwara et al. .................. 370/3
4,953,155  8/1990  Tangonan et al. .................. 370/1

OTHER PUBLICATIONS

G.-K. Chang et al. "A 3 Ghz Transimpedance OEIC Receiver for 1.3–1.55 μm Fiber–Optic Systems," *IEEE Photonics Technology Letters*, 1990, vol. 2, pp. 197–199.

W. S. Lee et al, "4–channel InGaAs/InP transimpedance optical receiver array OEICs for HDWDM applications," *Proceedings of European Conference on Optical Communications*, 1990, pp. 195-1–195-4.

G.-K. Chang et al, "High-performance monolithic dual–MSM photodetector for long–wavelength coherent receivers," *Electronics Letters*, 1989, vol. 25, pp. 1021–1022.

W. S. Lee et al., "1.2 Gbit/s fully integrated transimpedance optical receiver OEIC for 1.3–1.55 μm transmission systems," *Electronics Letters*, 1990, vol. 26, pp. 377–379.

N. Yamanaka et al, "A 1.5 Gbit/s GaAs Four–Channel Selector LSI with Monolithically Integrated Newly Structured GaAs Ohmic Contact MSM Photodetector and Laser Driver," *IEEE Photonics Technology Letters*, 1989, vol. 1, pp. 310–312.

W. S. Lee et al, "Monolithic GaInAs/InP photodetector arrays for high–density wavelength dividsion multiplexing (HDWDM) applications," *Electronic Letters*, 1988, vol. 24, pp. 1143–1145.

Y. Kanabar et al, "Demonstration of novel optical multichannel grating demultiplexer receiver (MGD) for HDWDM systems," *Electronics Letters*, 1989, vol. 25, pp. 817–819.

*Primary Examiner*—Edward L. Coles, Sr.
*Assistant Examiner*—Kinfe-Michael Negash
*Attorney, Agent, or Firm*—Leonard Charles Suchyta; Charles S. Guenzer

[57] ABSTRACT

A switched multi-channel optical receiver having N metal-semiconductor-metal photo-detectors receiving different optical signals, N switches selectively applying a bias voltage to one of the photo-detectors, and a single amplifier. All the elements are integrated in an InP opto-electronic integrated circuit. The switching to a single amplifier allows a reduced number of components.

18 Claims, 3 Drawing Sheets

ELECTRONICALLY SWITCHED MULTIPLE-CHANNEL OPTICAL RECEIVER

FIELD OF THE INVENTION

The invention generally relates to opto-electronic circuits. In particular, it relates to an optical receiver having an array of photo-detectors.

BACKGROUND ART

Fiber optic cables have established themselves as the transmission medium of choice for high-speed communications. Silica fibers can transmit optical signals within the 1.3 to 1.5 μm band over long distances with small distortion. The width of this band corresponds to a bandwidth of $3 \times 10^{14}$ Hz or 300 terahertz.

This huge bandwidth remains unexploited, in part, because both the transmitter and receiver are based on electronic components. For instance, the receiver includes a photo-detector which detects the intensity of the light signal and converts it to an electrical signal. However, conventional electronics are considerably slower than 300 terahertz. Conventional silicon semiconductor electronics have an upper limit of about 1 gigahertz ($1 \times 10^9$ Hz), although this limit is being gradually pushed up somewhat.

Compound semiconductors are known to offer higher speed performance. In particular, InP and its lattice-matched alloy InGaAs show particular promise for high-speed operation in this region of the infrared at which silica fibers transmit.

At these gigahertz frequencies, circuit design with discrete components becomes difficult because of parasitics and other reasons. As a result, much of the InP work has concentrated on integrated opto-electronic receivers. That is, an InP integrated circuit is built which includes both an InGaAs photo-detector and InP-based electronics, such as an amplifier. On an integrated circuit chip, parasitic capacitance and other delays can be minimized so that the speed of the circuit begins to approach that of the individual components. Receiver speeds of about 3 GHz have been reported for such circuits by Chang et al. in "A 3 GHz Transimpedance OEIC Receiver for 1.3-1.5 μm Fiber-Optic Systems," *IEEE Photonics Technology Letters*, volume 2, 1990, pages 197-199.

Nonetheless, even 3 GHz represents a very small fraction of the potential bandwidth of fibers. In order to avoid the limitations of electronics, a favored architecture for a fiber optic communication network uses wavelength-division multiplexing (WDM). A simplified version of WDM uses N lasers having N different oscillation frequencies within the chosen transmission band of the fiber. Separate electronic data signals modulate each of the lasers so that the N data signals are carried on N separate optical carrier frequencies. By optical means, the N optical signals are combined onto the one optical fiber. At the receiving end, the signals are optically separated by some kind of optical filter or splitter before being detected in N photo-detectors. The optical channels can be separated by as little as 1 nm. The photo-detectors need only have speeds corresponding to the individual data signals, e.g., 3 GHz, while the capacity of the receiver is increased by the factor N.

Lee et al. have reported an integrated four-channel receiver in "4-channel InGaAs/InP transimpedance optical receiver array OEICs for HDWDM applications," Proceedings of European Conference on Optical Communications, 1990, pages 195-1 through 195-4. They discussed a receiver in which the WDM optical signal on a fiber is focused onto an optical grating, which diffracts the different carrier frequencies to different positions. Each position corresponds to the photo-detector of one of four optical receivers. Each receiver uses a PIN diode for its photo-detector and has its own pre-amplifier section for the output of the photo-detector. Such an integrated multi-channel optical receiver has obvious advantages of economical fabrication and ease of alignment. Chang et al. have reported an integrated dual MSM detector in "High performance monolithic dual-MSM photo-detector for long-wavelength coherent receivers," *Electronics Letters*, volume 25, 1989, pages 1021-1022.

In one class of proposals for a WDM fiber-optic communications network, a receiving station would receive multiple WDM channels but would electrically output only a selected one of these. A possible example of such a receiving station receives different cable television services from different vendors on different WDM channels but outputs to the television input only one signal representing one vendor's services. Other examples exist in broadcast architectures for WDM telephone networks in which the receiver at the customer's premise can be used to select the wavelength-based channels. The Lee et al. multi-channel receiver is disadvantageous for such a switched optical receiver because it replicates the pre-amplifier N times for an N-channel receiver. Each pre-amplifier in the Lee et al. design includes 21 electronic components in addition to the attached optical detector. They stated that their 4-channel receiver represented the then highest level of InP opto-electronic integration. The N-times replication of components severely impacts yield of an advanced design, which is difficult enough to fabricate. Although Lee et al. did not suggest turning their PIN optical detectors on and off, it would be difficult to do so. A PIN photo-detector will output an electrical signal whenever it is illuminated with light, regardless of the reverse bias condition.

Yamanaka et al. have disclosed a four-channel, switchable receiver in "A 1.5 Gbit/s GaAs four-channel selector LSI with monolithically integrated newly structured GaAs ohmic contact MSM photodetector and laser driver," IEEE Photonics Technology Letters, volume 1, 1989, pages 310-312. Similarly to Lee et al., each of their MSM photo-detectors had a dedicated amplifier. Switching was performed on the amplified photo-currents. As a result, their GaAs integrated circuit had 369 components.

SUMMARY OF THE INVENTION

Accordingly, an object of the invention is provide a multi-channel optical receiver having a reduced number of components.

Another object of the invention is to provide a switchable multi-channel optical receiver for optical channel selection in WDM communication systems.

A further object of the invention is to provide such a receiver that can be built as an opto-electronic integrated circuit.

The invention can be summarized as a switched multi-channel optical receiver having a plurality of photo-detectors, preferably metal-semiconductor-metal detectors. Control signals control which one of the photo-detectors is enabled, e.g., by selective application of bias voltage to the detector. The electrical outputs of all the photo-detectors are connected to a single amplifier. Because the other photo-detectors are turned off, only the output of the selected photo-detector is amplified. Thereby, the component count in the amplifier section is reduced.

DETAILED DESCRIPTION OF THE PREFERRED EMBODIMENT

Figure 1:
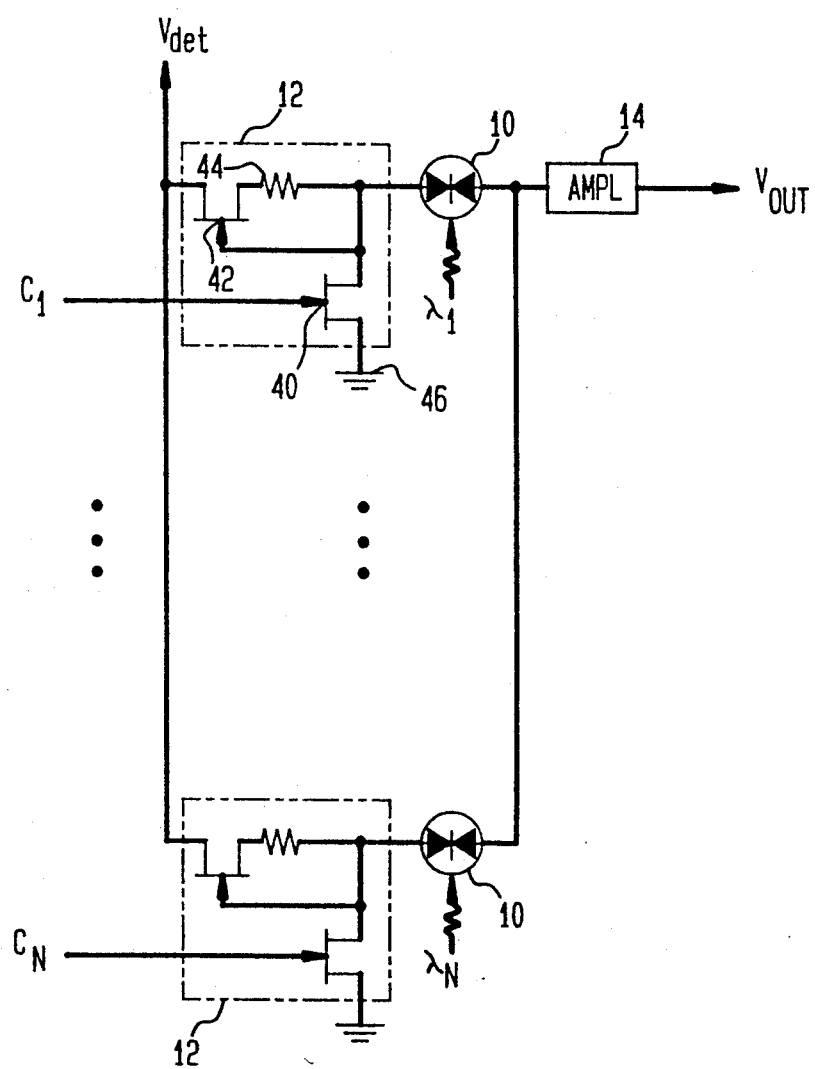
FIG. 1 is a circuit schematic representing an embodiment of the invention.

The schematic diagram of FIG. 1 illustrates a circuit embodying the present invention for an N-channel receiver. Only two of the channels are explicitly illustrated. Each channel has an metal-semiconductor-metal (MSM) photo-detector 10 illuminated by a respective beam of light having a wavelength $\lambda_i$. Associated with each detector 10 is a switch 12 controlled by a separate control signal $C_i$. Each switch 12 selectively applies a bias voltage supplied by a source of voltage $V_{det}$ to the selected detector 10. All photo-detectors 10 supply their photocurrents to a single amplifier 14, which outputs an amplified signal $V_{out}$.

Figure 2:
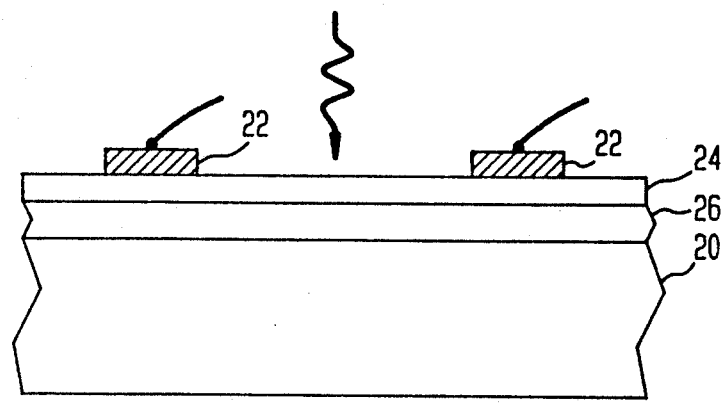
FIG. 2 is a cross-sectional view of a metal-semiconductor-metal (MSM) photo-detector.

The MSM photo-detector 10 is electrically equivalent to two back-to-back Schottky diodes. Its structure is illustrated in the cross-section of FIG. 2. Light is absorbed in a relatively thick ($\sim 1.2$ μm) absorption layer 20 of InGaAs. The absorption layer 20 is separated from two metallic electrodes 22 by a 30 nm thick barrier layer 24 of InAlAs and a 20 nm thick graded layer 26 of InAlGaAs. The barrier and graded layers 24 and 26 are included to raise the Schottky barrier heights of the metals on InGaAs. More details of the MSM photo-detector 10 and its fabrication have been disclosed by Chang et al. in their *Electronics Letters* article.

Figure 3:
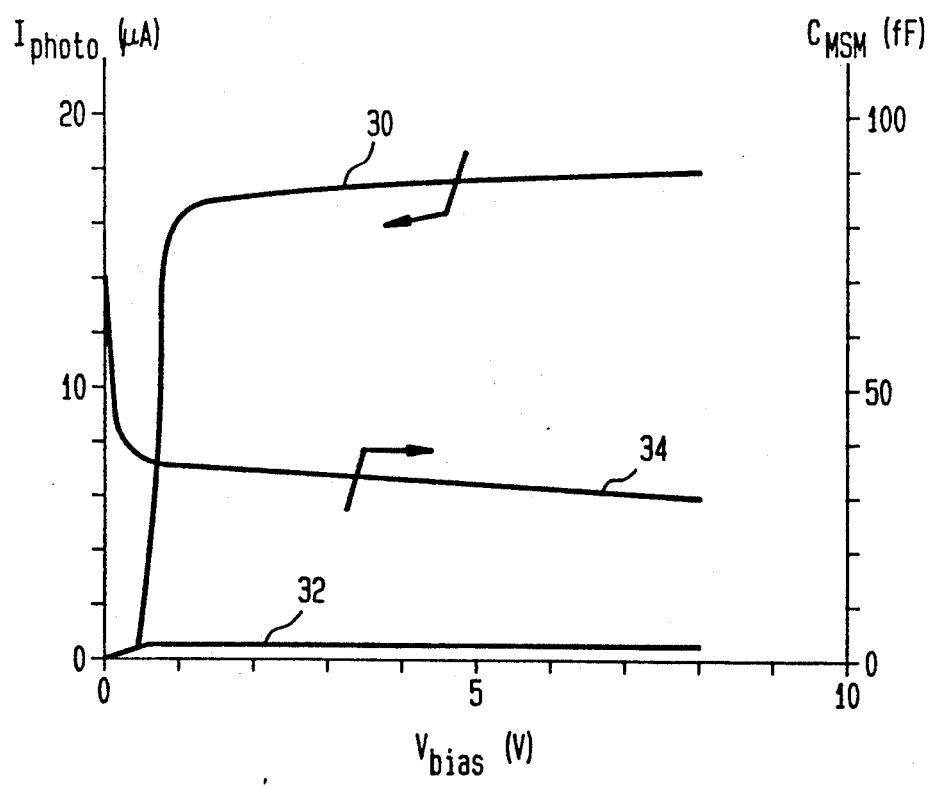
FIG. 3 is a graph illustrating the bias-voltage dependence of the photoresponse and the capacitance of an MSM photo-detector.

The photo-charge generated in the absorption layer 20 provides a current path between the electrodes 22. An advantage of an MSM photo-detector is that the photocurrent is very dependent upon the voltage bias applied across it. The MSM photo-detector differs from a photoconductor detector in the presence of the back-to-back Schottky barriers of the metal-to-semiconductor contact. In our embodiment of InAlAs/InGaAs, this provides a low zero-bias photoresponse, unlike the ohmic contacts of the photoconductor detector. The optical and electrical characteristics as a function of bias voltage are illustrated in FIG. 3 for a 30 μm×30 μm MSM detector at an optical input power of 50 μW. As illustrated by the photocurrent curve 30, the photoresponse drops sharply below 1 V of bias. The dark current is given by curve 32 and is 20 nA at 5 V bias. As shown by the capacitance curve 34, the capacitance begins to rise below this bias. Nonetheless, the capacitance for a large area detector is relatively small, $\sim 30$ fF. Thus, if the MSM photo-detectors 10 are biased in the OFF state at 0.5 V and in the ON state at 7 V, all the unselected photo-detectors 10 will contribute minimally to the current supplied to the amplifier 14.

The embodiment of the invention illustrated in FIG. 1 has been fabricated as an optoelectronic integrated circuit with 4 MSM photo-detectors, and the finished circuit was tested. The fabrication closely follows the procedure described by Chang et al. in their *IEEE Photonics Technology Letters* article. Details of the MSM photo-detector are found in the Chang et al. article in *Electronic Letters*. Briefly, organometallic chemical vapor deposition (OMCVD) deposited layers of InP, InAlAs and InGaAs on an insulating InP substrate. There was grown a vertical high electron-mobility transistor (HEMT) structure using a conventional InAlAs/InGaAs modulation-doped heterostructure. A HEMT is a form of a field-effect transistor (FET). The MSM detector layers of FIG. 2 were grown on top of the HEMT structure, which did not directly affect the MSM.

Figure 4:
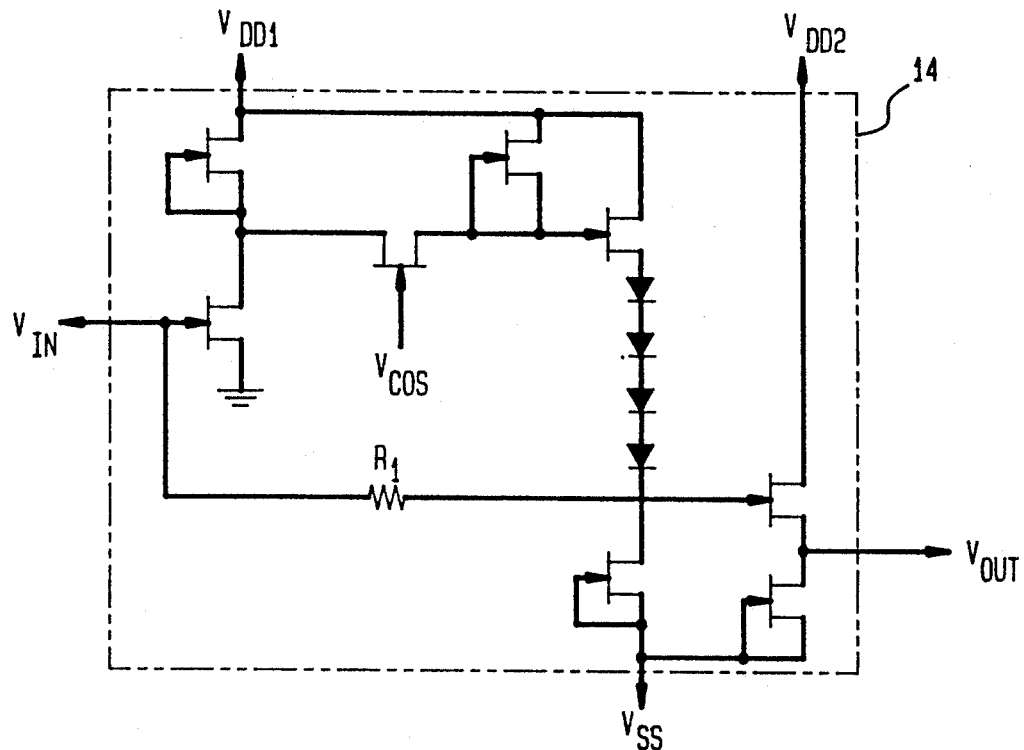
FIG. 4 is a schematic diagram of the circuit for a transimpedance amplifier usable with the invention.

The amplifier 14 is a transimpedance amplifier having the detailed circuit diagram of FIG. 4. The feedback resistor has a resistance of $R_f = 540 \Omega$. The circuit is designed to operate with voltage supplies of: $V_{DD1} = 5$ V, $V_{DD2} = 3$ V, $V_{SS} = -2$ V; $V_{CGS} = 0.7$ V; and $V_{det} = 6$ V. With these supply voltages, there is a DC voltage bias of $-0.9$ V at the input $V_{in}$ of the amplifier 14.

The transistors of the amplifier 14 and the switches 12 are HEMTs having gate lengths of 1.3 μm and a source-to-drain space of 5.5 μm. They individually show an extrinsic transconductance of 240 mS/mm and a pinch-off voltage of $-1.4$ V. They exhibit a DC voltage gain of 20, a drain current $I_{dss}$ of 250 mA/mm, and a unit current gain cutoff frequency of 20 GHz.

The circuit of FIG. 1 differs from that of the Chang et al. articles by including the switches 12 and multiple MSM photo-detectors 10.

The fabricated circuit includes four 30 μm×30 μm MSM photo-detectors 10 arranged in a linear array having a pitch of 250 μm.

A switch 12 is associated with each MSM photo-detector 10. Each switch 12 includes a control HEMT 40, a biasing HEMT 42, and a current-limiting resistor 44. The control HEMT 40 is connected between a switch source ground 46, held at $-1$ V, and the biasing input to the MSM photo-detector 10. Its control gate is connected to the control signal $C_i$ for that MSM photo-detector 10. The biasing HEMT 42 is connected between the bias voltage supply $V_{det}$ and the current-limiting resistor 44. Its control gate is connected around the resistor 44 to the input of the MSM photo-detector 10. The current-limiting resistor 44 has a designed resistance of 500 Ω, which limits the current to 3 mA from the 6 V value of $V_{det}$ to the $-1$ V source ground 46.

The control HEMT has a designed pinch-off voltage of $-1.5$ V. In the OFF state, a control signal $C_i$ of $-1$ V (0 V from the source potential of the HEMT 40) causes the control HEMT 40 to be fully on and capable of conducting a large current with a small drain-to-source voltage drop. However, the maximum current flow through the biasing HEMT 42 is limited by the self-biasing current-limiting resistor 44, which regulates the current flow through the biasing HEMT 42 to less than 3 mA. The 3 mA limiting current also flows through the control HEMT 40. In this case, the drain voltage of the control HEMT 40 is then at $-0.4$ V because the control HEMT 40 is working as a linear resistor with 200 Ω resistance. Therefore, the net voltage across the MSM photo-detector is 0.5 V.

In the ON state, a control signal $C_i$ of $-1.5$ V pinches off the control HEMT 44, curtailing current flow therethrough. The biasing input to the MSM photo-detector 10 is held at $V_{det}=6$ V, and the total bias across it is 6.9 V.

The integrated receiver was tested and showed good response at speeds up to 2 Gb/sec. Even at the photo-detector pitch of 250 μm, the optical crosstalk was estimated to be $-30$ dB.

Figure 5:
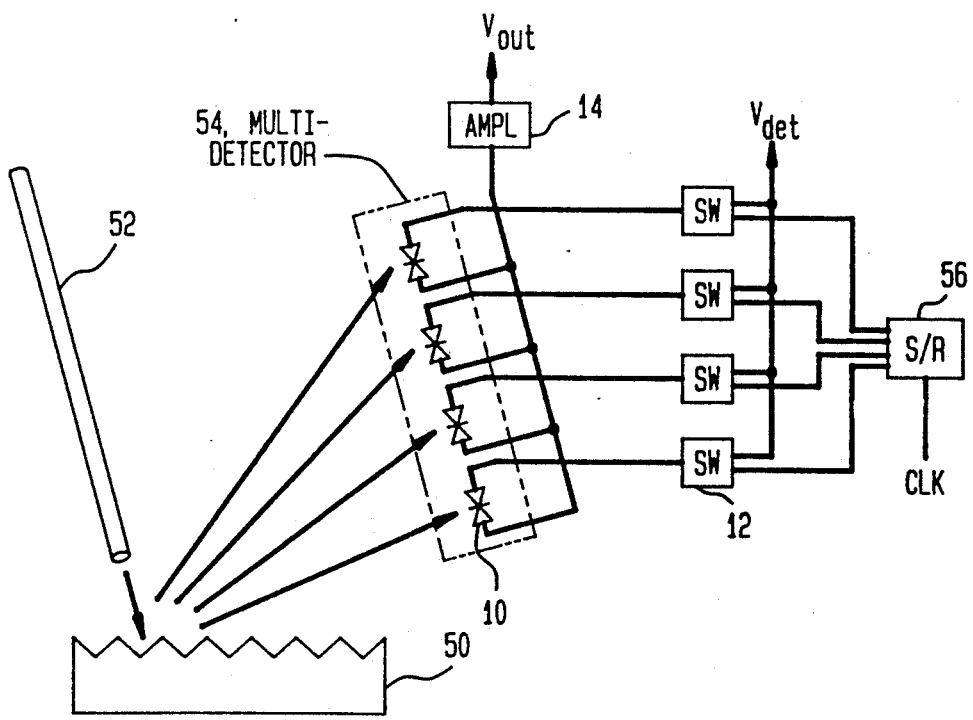
FIG. 5 is a block diagram of a WDM communication receiver using the receiver of the invention.

The integrated multi-channel receiver of the described embodiment can be used as a WDM receiver by spatially separating the WDM frequency channels to the respective MSM photo-detectors 10. As illustrated in FIG. 5, a diffraction grating 50 can be used in conjunction with an optical fiber 52 and a multi-element detector 54, as has been disclosed both by Lee et al. in "Monolithic GaInAs/InP photo-detector arrays for high-density wavelength division multiplexing (HDWDM) applications," *Electronics Letters*, volume 24, 1988, pages 1143-1145 and by Kanabar et al. in "Demonstration of novel optical multichannel grating demultiplexer receiver (MGD) for HDWDM systems," *Electronics Letters*", volume 25, 1989, pages 817-819.

The switching speed between optical channels of the tested embodiment was faster than a few hundred MHz and was mainly limited by the RC discharge time of the HEMTs and the supplied switching power. Therefore, the receiver could convert and interleave bits from the parallel optical input channels to serial electronic data multiplexed in the time domain. The N control signals $C_i$ would be sequentially and cyclically activated. Such an architecture has been proposed by Yamanaka et al. in the previously cited article. This control could be implemented with a wrap-around shift register 56 having a clock control input and parallel outputs to the $C_i$ control lines.

Instead of interleaving bits, the receiver of the invention can interleave multi-bit packets carried at different optical wavelengths.

A comparison of the detector and switch sections of FIG. 1 with the transimpedance amplifier of FIG. 4 shows that most of the components are in the amplifier. The invention, in providing an array of switchable MSM photodetectors on the front end, eliminates the need to replicate the amplifier, and thus it provides a fast, integrated receiver with a substantial reduction in the number of components from that available in the prior art. The simplified optoelectronic integrated circuit is thus bound to have higher yield, to be less expensive, and to be more reliable.

What is claimed is:

1. A multi-channel optical receiver, comprising:
   a plurality N of photo-detectors, wherein N is an integer greater than 1;
   N biasing means, each capable of selectively biasing a respective one of said photo-detectors with one of two non-zero voltages, for activating a selected one of said photo-detectors, any of said photo-detectors biased with a first one of said two non-zero voltages being activated and any of said photo-detectors biased with a second one of said two non-zero voltages being deactivated; and
   a single amplifier receiving outputs of all said N photo-detectors.

2. A receiver as recited in claim 1, wherein electrical connections between said N photo-detectors and said amplifier are unswitched.

3. A receiver as recited in claim 1, wherein said photo-detectors comprise metal-semiconductor-metal photo-detectors.

4. A receiver as recited in claim 1, further comprising:
   an optical fiber carrying a wavelength-division multiplexed optical signal; and
   a wavelength disperser operatively interposed between said optical fiber and said N photo-detectors, whereby different wavelengths of said optical signal fall upon different ones of said photo-detectors.

5. A receiver as recited in claim 1, wherein said activating means activate said N photo-detectors in a predetermined cyclical sequence.

6. A receiver as recited in claim 1 wherein said two non-zero voltages selectively biased across said photo-detectors have a same voltage polarity.

7. A multi-channel optical receiver, comprising:
   a plurality N of metal-semiconductor metal photo-detectors, wherein N is an integer greater than 1;
   a bias voltage source;
   N means electrically connected to respective ones of said metal-semiconductor-metal photo-detectors for biasing a selected one of said metal-semiconductor-metal photo-detectors, wherein each of said biasing means comprises an electronic gate circuit receiving a selection signal associated with said each biasing means and selectively connecting a first side of said respective metal-semiconductor-metal photo-detector to said bias voltage source, a second side of said respective metal-semiconductor-metal photo-detector being connected to a node that is common to all of said biasing means and is connected to an input of said amplifier;
   wherein said each electronic gate circuit comprises:
   a first transistor connected on a first current electrode to said bias voltage source;
   a second transistor connected on a first current electrode to a common reference potential, on a second current electrode to said first side of said metal-semiconductor-metal photo-detector and to a control electrode of said first transistor, and on a control electrode to said associated selection signal; and
   a resistor connected between said second current electrode of said first transistor gate and said first side of said metal-semiconductor-metal photo-detector.

8. A receiver as recited in claim 6, wherein said first and second transistors are HEMTs.

9. A receiver as recited in claim 8, wherein said N photo-detectors, said N activating means, and said amplifier are integrated into an opto-electronic integrated circuit.

10. A multi-channel optical receiver, comprising:
    a plurality N of metal-semiconductor-metal photo-detectors arranged in an array, wherein N is an integer greater than 1;
    a source of a first non-zero biasing voltage and of a second non-zero biasing voltage;
    a plurality N of switches responsive to a plurality N of respective control signals for applying said first biasing voltage across selected ones of said photo-detectors and for applying said second biasing voltage across unselected ones of said photo-detectors, each of said photo-detectors impinged with light and applied with said first biasing voltage generating a respective photocurrent; and an amplifier receiving all of said photocurrents from all of said photo-detectors.

11. A receiver as recited in claim 10, further comprising continuous and uninterruptible electrical connections conveying said photocurrents from all of said photo-detectors to said amplifier.

12. A receiver as recited in claim 10, wherein said first and second non-zero biasing voltages selectively applied across said metal-semiconductor-metal photo-detectors have a same voltage polarity.

13. An optical receiver, comprising:
   a metal-semiconductor-metal photo-detector;
   biasing means for selectively biasing said photo-detector with one of two non-zero voltages, said photo-detector being activated by a first one of said two non-zero voltages and being deactivated by a second one of said two non-zero voltages; and
   an amplifier receiving a photo-current from said photo-detector.

14. An optical receiver as recited in claim 13, wherein said two non-zero voltages applied across said photo-detector both have a same voltage polarity.

15. An optical receiver as recited in claim 13, further comprising a source of voltage and wherein said biasing means comprises an electronic gate circuit receiving a selection signal and selectively connecting a first side of said metal-semiconductor-metal photo-detector to said voltage source, a second side of said metal-semiconductor-metal photo-detector being connected to an input of said amplifier.

16. A receiver as recited in claim 15, wherein said electronic gate circuit comprises:
   a first transistor connected on a first current electrode to said source of voltage;
   a second transistor connected on a first current electrode to a reference potential, on a second current electrode to said first side of said metal-semiconductor-metal photo-detector and to a control electrode of said first transistor, and on a control electrode to said selection signal; and
   a resistor connected between said second current electrode of said first transistor gate and said first side of said metal-semiconductor-metal photo-detector.

17. A receiver as recited in claim 13, comprising a plurality N of said photo-detectors and plurality N of said biasing means, wherein N is an integer greater than one, each of said N photo-detectors being selectively biased by a respective one of said N biasing means.

18. A receiver as recited in claim 17, wherein said amplifier receives outputs of all of said N photo-detectors.

* * * * *